United States Patent
Gongwer

(10) Patent No.: US 6,181,599 B1
(45) Date of Patent: Jan. 30, 2001

(54) METHOD FOR APPLYING VARIABLE ROW BIAS TO REDUCE PROGRAM DISTURB IN A FLASH MEMORY STORAGE ARRAY

(75) Inventor: Geoff Gongwer, Los Altos, CA (US)

(73) Assignee: SanDisk Corporation, Sunnyvale, CA (US)

( * ) Notice: Under 35 U.S.C. 154(b), the term of this patent shall be extended for 0 days.

(21) Appl. No.: 09/291,249

(22) Filed: Apr. 13, 1999

(51) Int. Cl.[7] .................................................. G11C 16/04
(52) U.S. Cl. ................................ 365/185.18; 365/185.24
(58) Field of Search ........................ 365/185.18, 185.23, 365/185.29, 185.33, 185.24

(56) References Cited

U.S. PATENT DOCUMENTS

| | | | |
|---|---|---|---|
| 4,377,857 | 3/1983 | Tickle | 365/185.29 |
| 5,177,705 | 1/1993 | McElroy et al. | 365/185.29 |
| 5,267,209 | 11/1993 | Yoshida | 307/46 |
| 5,280,446 | 1/1994 | Ma et al. | 365/185.23 |
| 5,446,690 | 8/1995 | Tanaka et al. | 365/185.03 |
| 5,555,521 | 9/1996 | Hamada et al. | 365/185.25 |
| 5,604,711 | 2/1997 | Cheung | 365/185.15 |
| 5,619,450 | 4/1997 | Takeguchi | 365/185.18 |
| 5,677,875 | 10/1997 | Yamagata et al. | 365/185.06 |
| 5,818,757 | * 10/1998 | So et al. | 365/185.18 |
| 5,886,923 | 3/1999 | Hung | 365/185.33 |
| 5,920,501 | * 7/1999 | Norman | 365/185.29 |

FOREIGN PATENT DOCUMENTS

| | | |
|---|---|---|
| 1166874 | 3/1999 | (JP) . |
| 1187662 | 3/1999 | (JP) . |
| WO9819310 | 5/1998 | (WO) . |

OTHER PUBLICATIONS

Fujiwara, I. et al. (1998) "0.13 μm MONOS Single Transistor Memory Cell with Separated Source Lines" *IDEM Technical Digest*, International Electron Devices Meeting 1998, pp. 36.7.1–36.7.4.

Fujiwara, I. Et al. (2000) "0.13 μm Metal–Oxide–Nitride–Oxide–Semiconductor Single Transistor Memory Cell with Separated Source Line" *Jpn. J. Appl. Phys.* 39:417–423.

Lin, R. et al. (2000) "New Self–Adjusted Dynamic Source Multilevel P–Channel Flash Memory" *IEEE Transactions on Electron Devices* 47(4):841–847.

Luderman, B.L. et al. (1996) "Reducing Power Dissipation in Low Voltage Flash Memories" *Proceedings Ninth Annual IEEE International ASIC Conference and Exhibit*, Session 10, pp. 305–307.

Nakayama, T. et al. (1989) "A 5–V–Only One–Transistor 256K EEPROM with Page–Mode Erase" *IEEE Journal of Solid–State Circuits* 24(4):911–915.

* cited by examiner

*Primary Examiner*—Trong Phan
(74) *Attorney, Agent, or Firm*—Majestic, Parsons, Siebert & Hsue

(57) ABSTRACT

Program disturb in a Flash storage array is reduced by applying a voltage level that depends on the threshold level of a previously programmed cell to the word-line of that cell during programming of subsequent cells on the same bit-line. By applying higher voltages to word-lines containing unselected programmed memory cells with higher threshold voltages, program disturb due to these higher threshold cells is reduced.

14 Claims, 8 Drawing Sheets

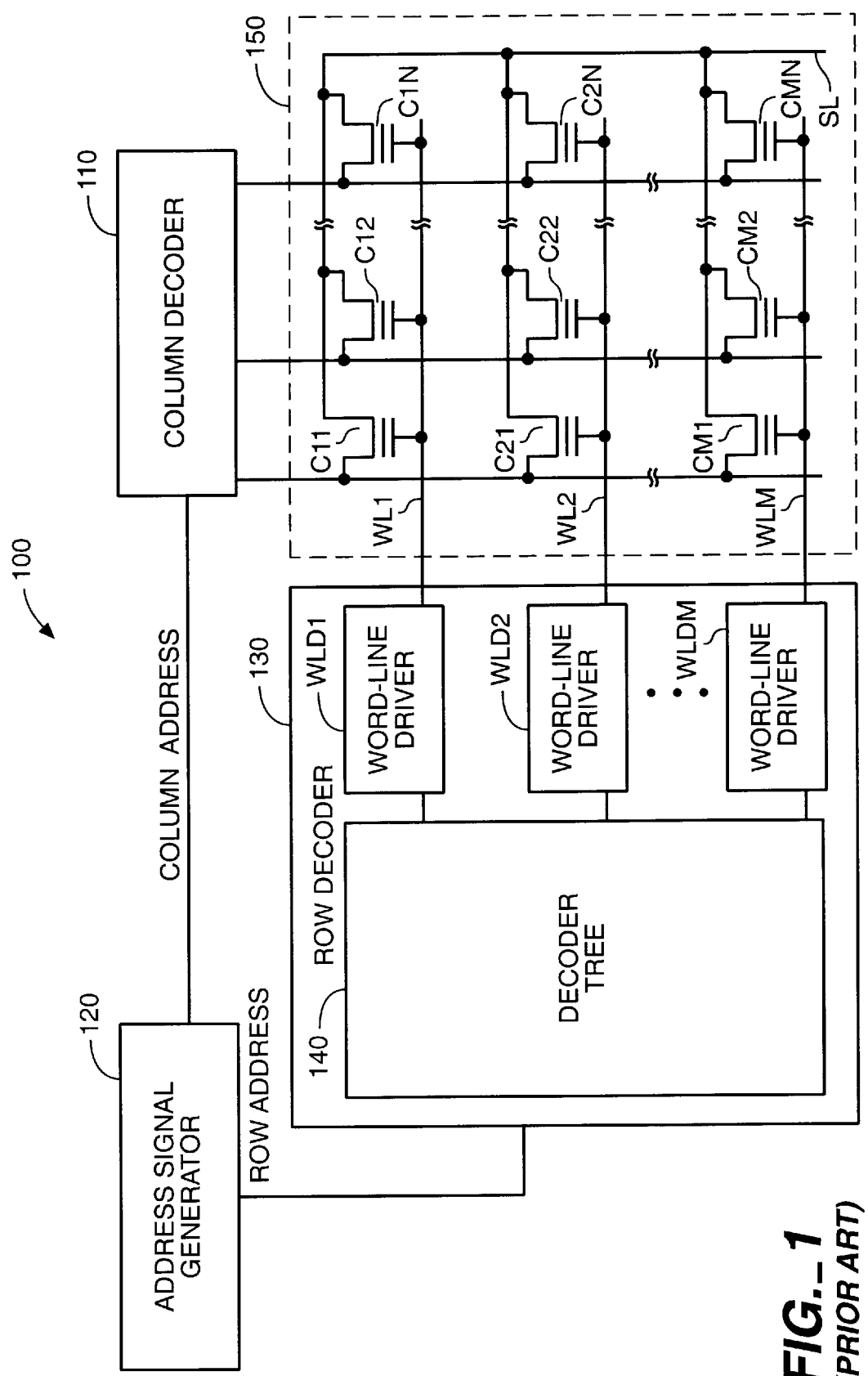
FIG._1
*(PRIOR ART)*

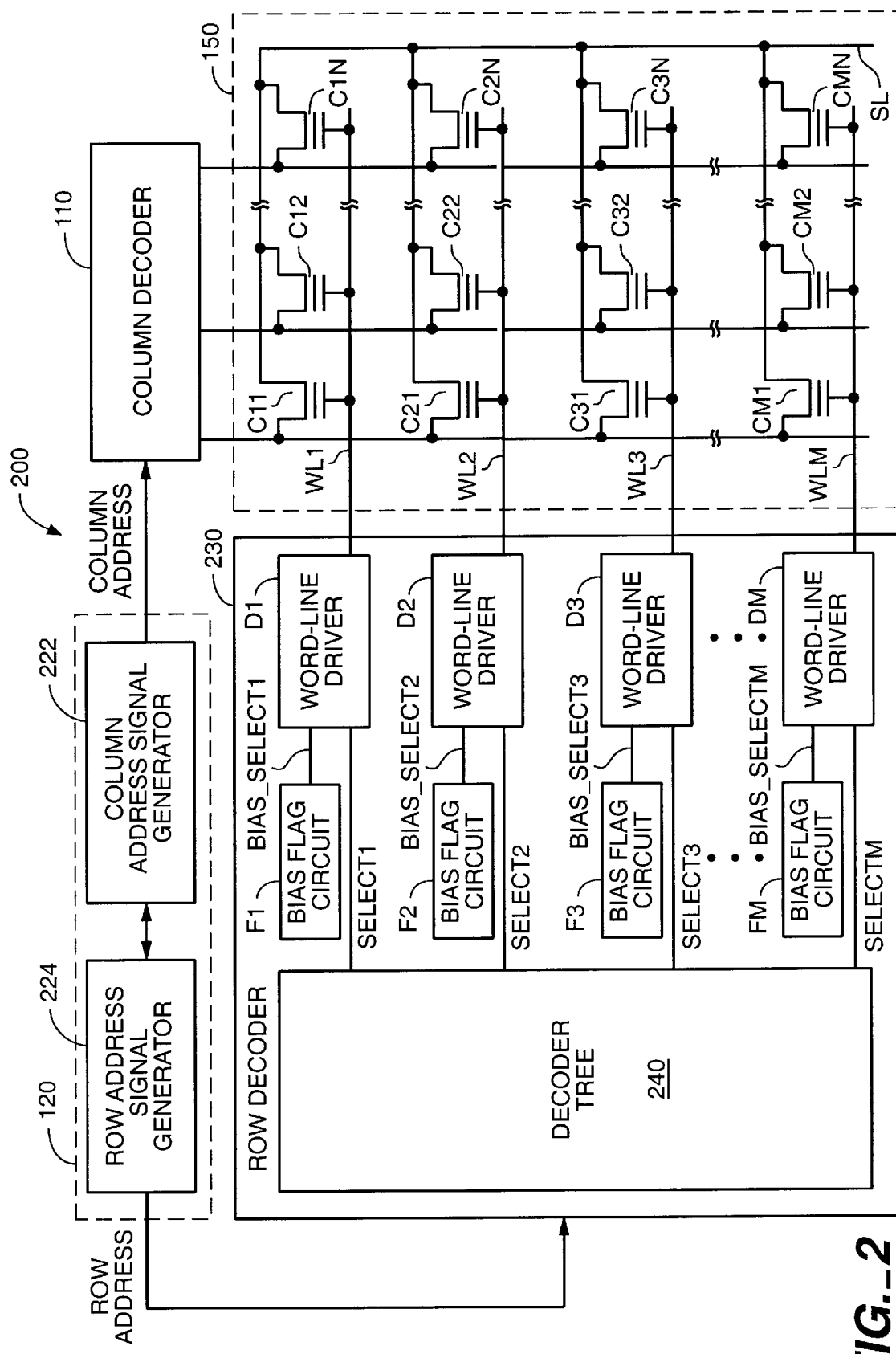
FIG._2

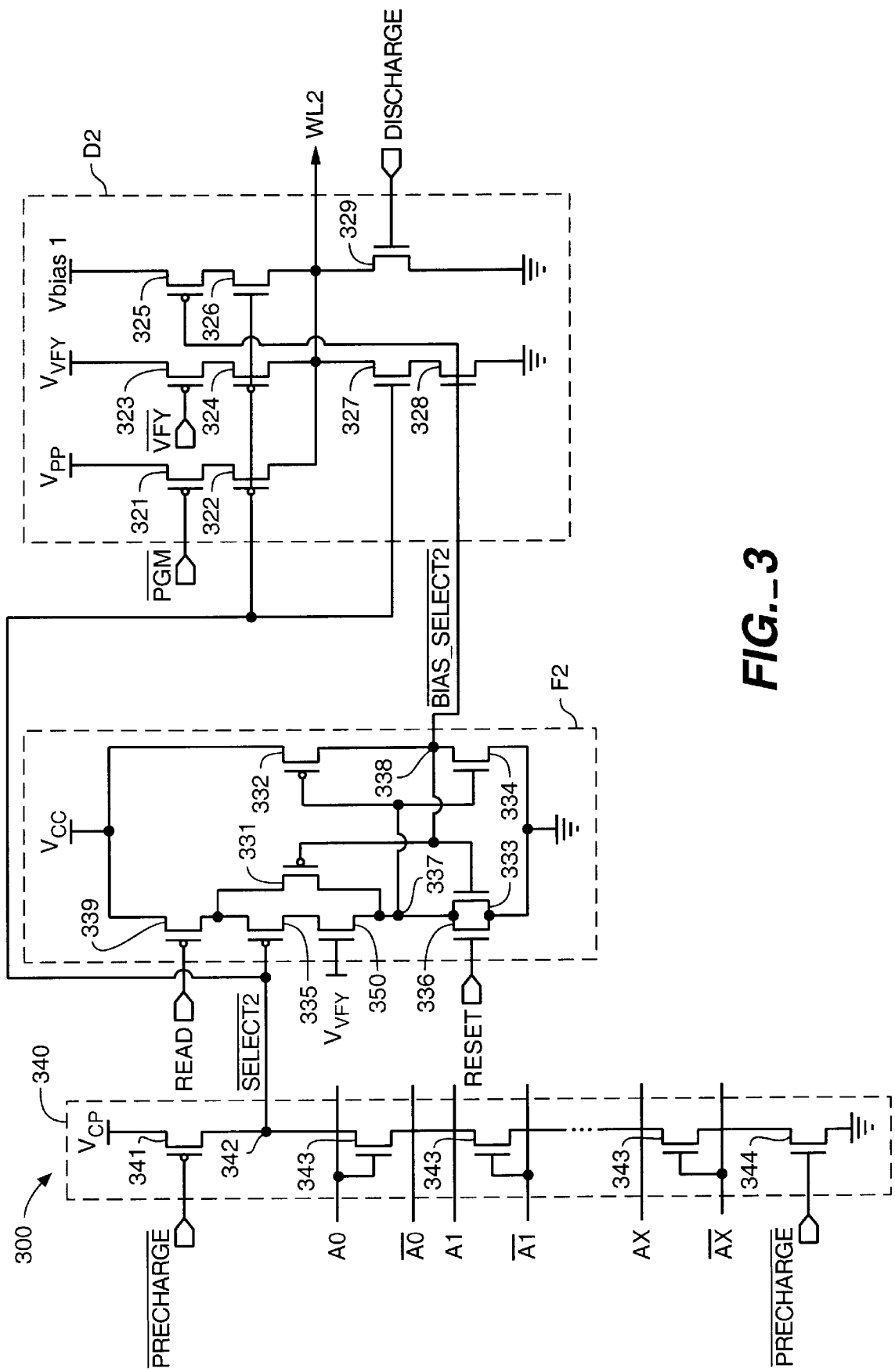
FIG._3

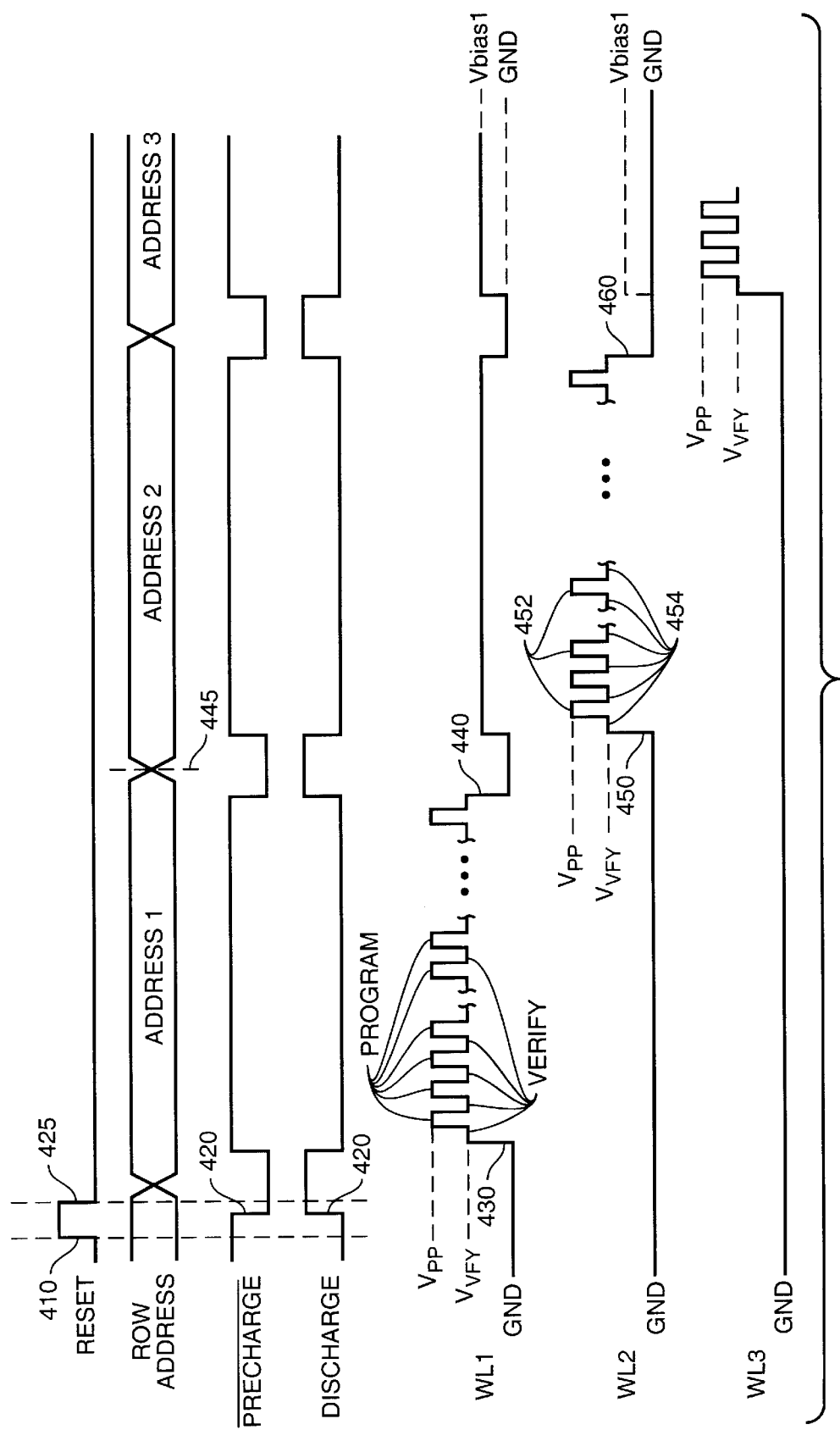
FIG._4

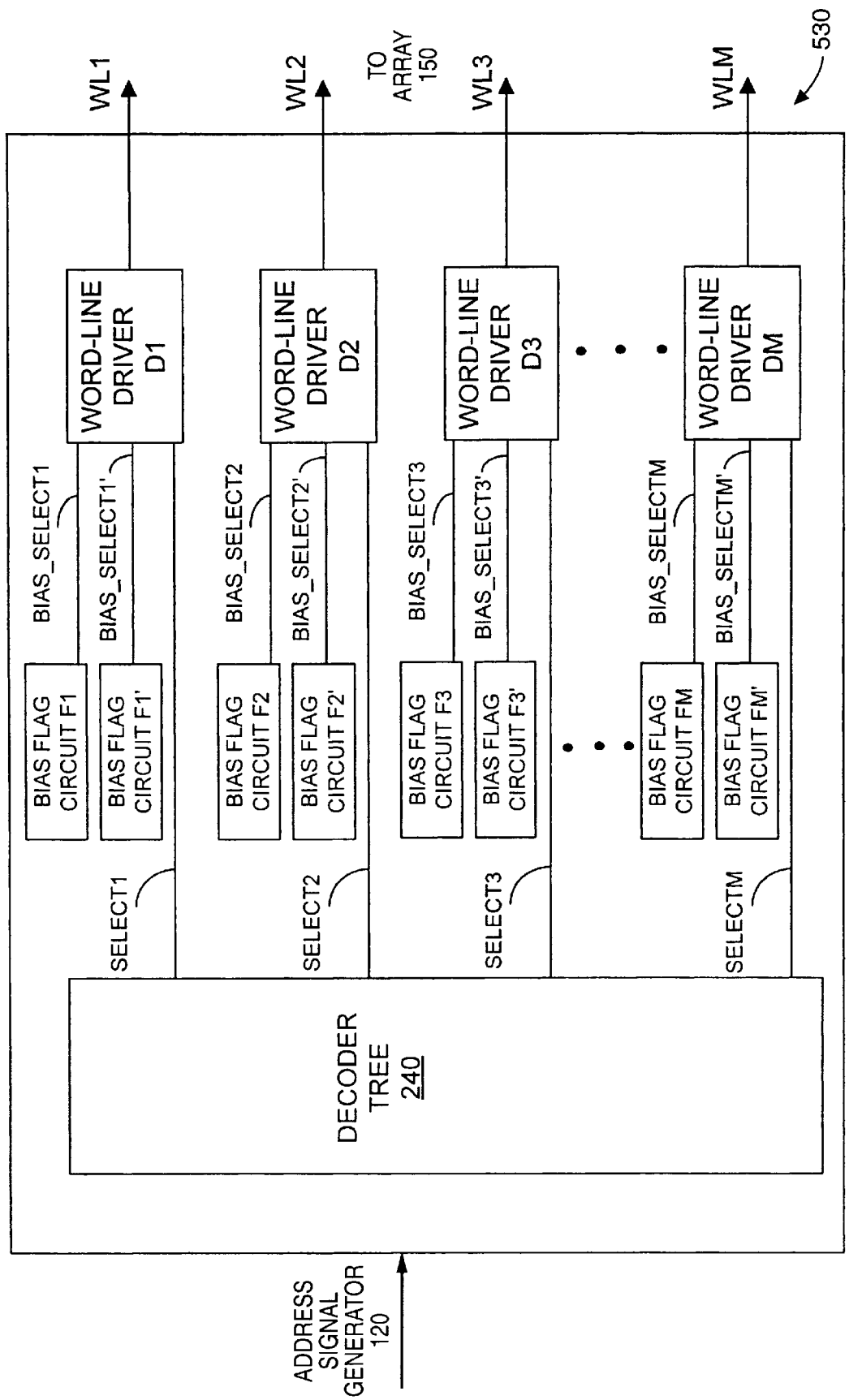
FIG._5

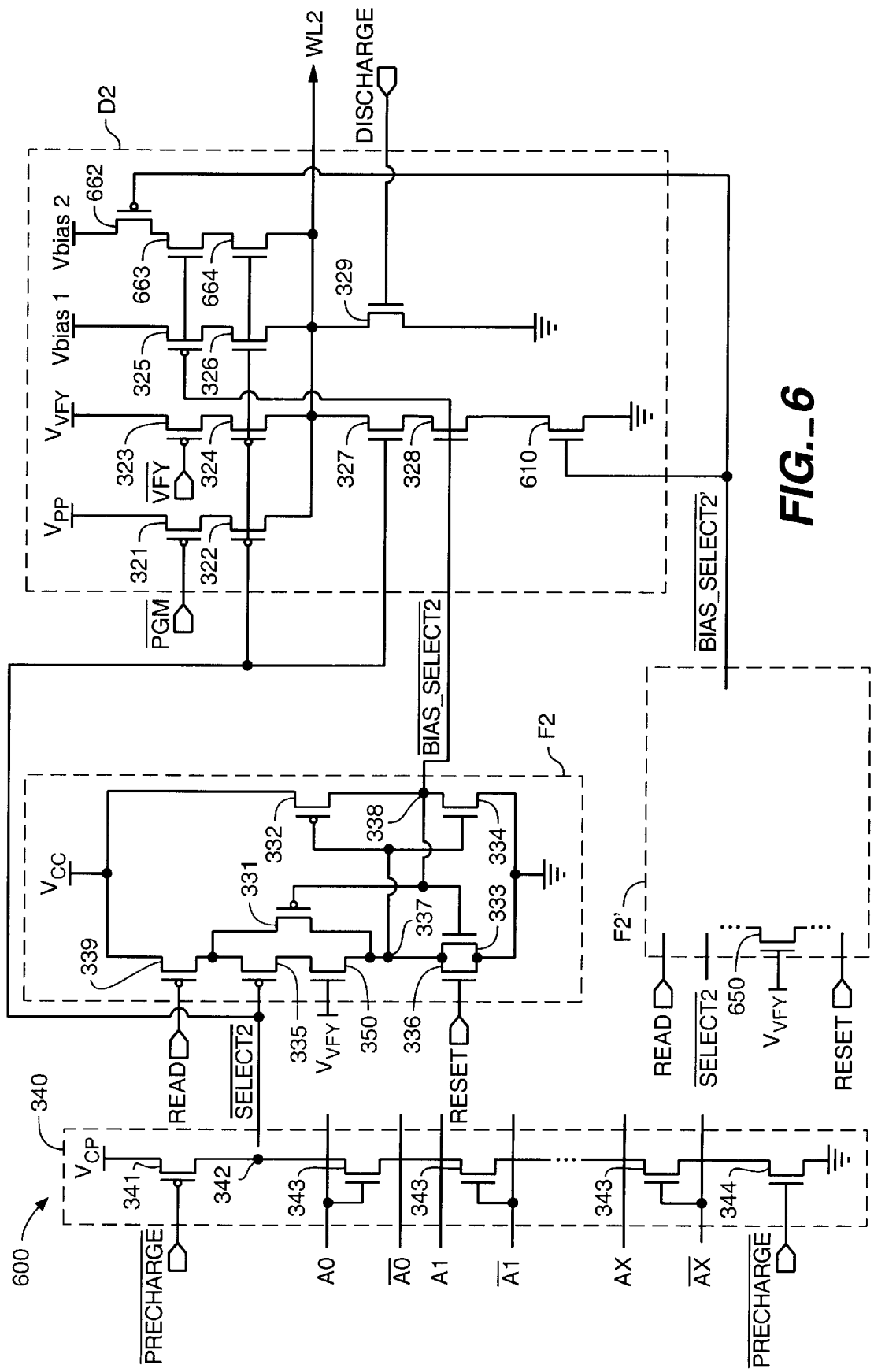
FIG._6

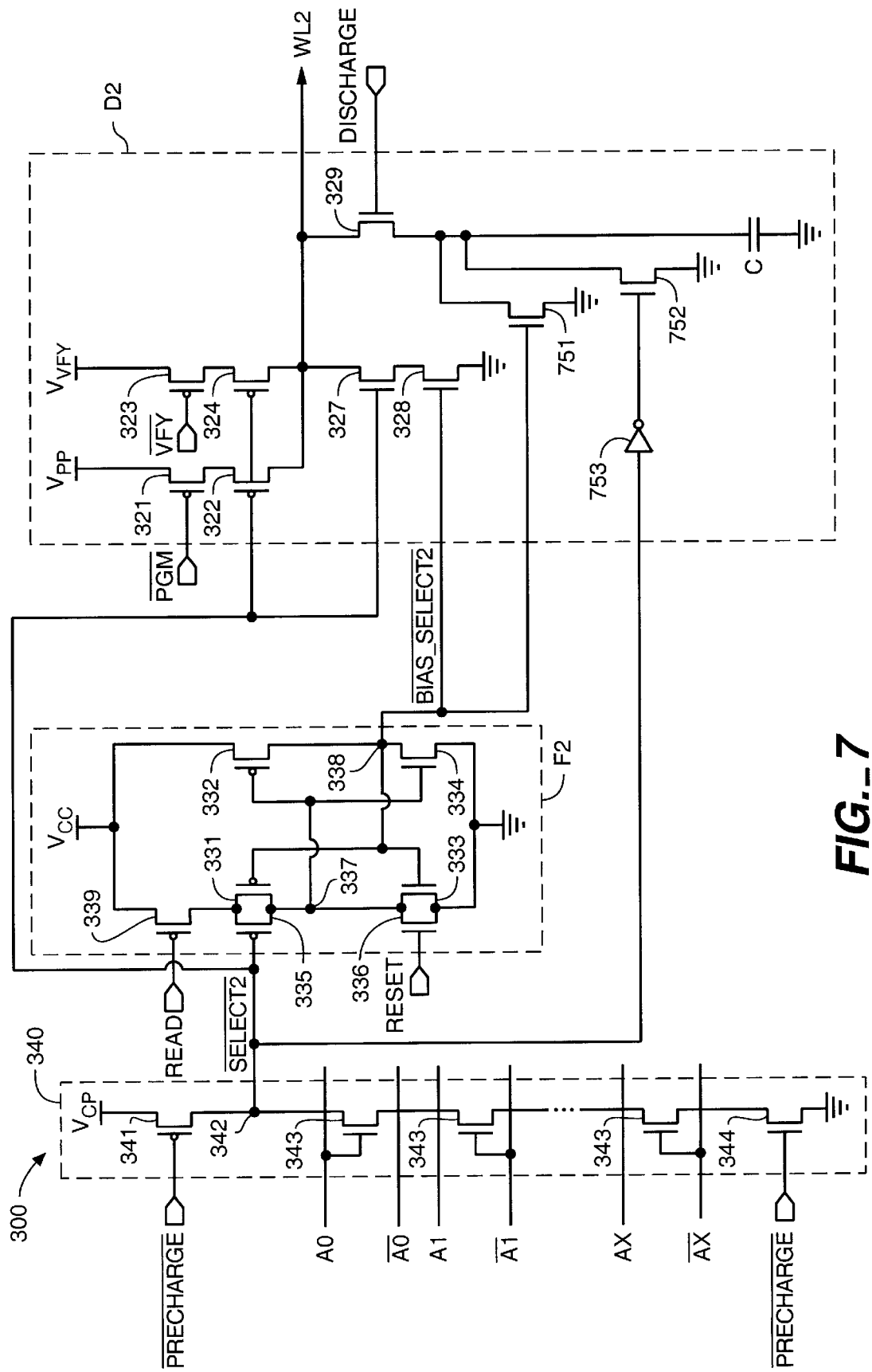
FIG._7

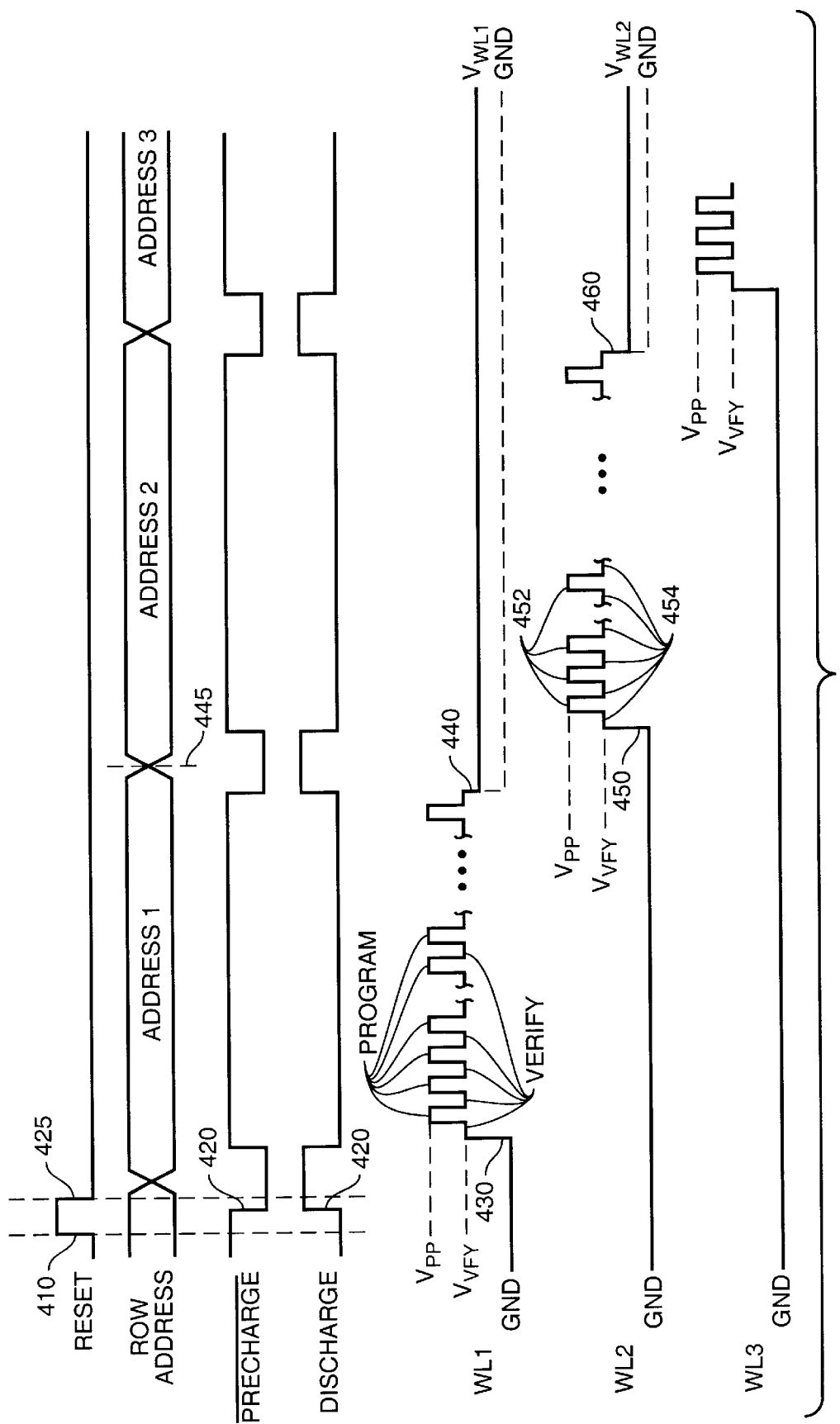
FIG._8

METHOD FOR APPLYING VARIABLE ROW BIAS TO REDUCE PROGRAM DISTURB IN A FLASH MEMORY STORAGE ARRAY

BACKGROUND

1. Field of the Invention

This invention relates generally to non-volatile semiconductor memories, and more particularly, to methods and structures for reducing the disturbance of threshold voltages when writing to such memories.

2. Description of Related Art

Non-volatile semiconductor memories such as EPROMs, EEPROMs, and Flash memories are well known. In such memories, a threshold voltage Vt of a memory cell indicates a data value stored in the memory cell. When writing (programming) to a selected memory cell in a conventional non-volatile memory array, programming voltages are applied via a word-line (WL) connected to a control gate of the selected cell, via a bit-line (BL) connected to a drain of the selected cell, and a via a source-line (SL) coupled to a source of the selected cell. The combination of programming voltages changes the threshold voltage of the selected cell, typically by causing Fowler-Nordheim (F-N) tunneling or channel hot electron (CHE) injection which charges (or discharges) a floating gate in the selected memory cell.

For example, to induce CHE injection in a selected memory cell containing a typical n-channel floating gate transistor, a high voltage Vpp (e.g., approximately 9 to 12 volts or higher) is applied as the control gate voltage Vg to the WL containing the selected cell, a high voltage (e.g., approximately 4.5 to 5.5 volts or higher) is applied as the drain voltage Vd to the BL containing the selected cell, and a low voltage (e.g., near 0 volt) is applied as the source voltage Vs to the SLs. Hot electrons are injected into the floating gate to increase the threshold level with respect to the control gate, thereby programming the selected cell. By adjusting the magnitude and/or duration of the programming voltage Vpp, the selected cell can be programmed to a desired threshold voltage Vt.

During a write to a selected memory cell, the high bit-line and word-line voltages for the selected memory cell can create large voltage differences between the floating gate and drain of unselected memory cells and thereby induce Fowler-Nordheim tunneling that disturbs the threshold voltages of these unselected memory cells by causing electrons to tunnel out or escape from the floating gate to drain. The voltage difference between the drain and floating gate of an unselected memory cell subjects the memory cell to a disturb typically referred to program or drain disturb. Since the Fowler-Nordheim tunneling current is exponentially dependent on the electric field in the gate oxide between the bit-line and floating gate, program disturb will worsen significantly even with a small increase in the electric field. If this F-N tunneling current is high enough for a long enough time, the threshold voltages of previously programmed cells can be lowered significantly, thereby adversely affecting the accuracy of the storage array.

The disturbance of threshold voltages can accumulate through repeated programming of memory cells in the same column or row and change the data values stored in unselected cells. Depending on the memory, a data value stored in a memory cell may be binary (a bit 0 or 1), multi-level (a value from a set of discrete values), or analog (a value within a continuous range of possible values). For binary memories, the accumulated disturbance of a threshold voltage must be relatively large (on the order of a volt or more) to change the threshold voltage from a state indicating a first binary value to a state indicating the second binary value. However, for multi-level or analog memories, distinguishable threshold voltage differences for data values can be a few millivolts, and any small disturbances of threshold voltages limit the theoretically achievable threshold voltage resolution.

The total accumulative disturb is dependent on the number of cells on a bit-line, the write time of a cell, the area and gate oxide thickness between the drain and the floating gate, and the drain voltage applied for programming. Thus, program disturb can limit, among other things, the number of cells that are allowed on a single bit-line, as well as the thickness of the gate dielectric of the memory cells. On the other hand, reducing bit-line lengths decreases program disturb. For example, a large array can be divided into several smaller arrays so that fewer memory cells are on the same row or column. As a result, programming a selected memory cell disturbs fewer unselected memory cells, and the accumulated programming disturb time for each memory cell is less. For example, dividing a large array into four small arrays can divide bit-line and word-line lengths in half and reduce accumulation of threshold voltage disturbance in half. However, four small arrays have about twice the overhead in decoding circuitry, as does one large array containing the same number of memory cells, which increases the cost and size of the memory system.

Accordingly, it is desired to reduce program disturb without the adverse effects of conventional methods and memories discussed above.

SUMMARY

In accordance with an aspect of the invention, applying a variable bias voltage to control gates of unselected memory cells containing data values (i.e., previously programmed cells) reduces program disturb. The amount of bias voltage applied depends on the threshold voltage of the unselected programmed memory cell. The bias voltage increases the voltage of the floating gate (making the floating gate voltage less negative) through capacitive coupling between the control gate and the floating gate and thus reduces the voltage difference between the floating gate and the drain in memory cells in the same column as a selected memory cell being programmed. The bias voltage reduces the electric field in the gate oxide, which reduces program disturb to the corresponding floating gate.

The bias voltage is only applied to word-lines of rows which currently hold data values, but not to the unselected memory cells which are in the erased state so that erased memory cells remain off during programming. Application of a bias voltage to erased memory cells is not required because a small disturbance of the threshold voltage of an erased cell does not affect data values or operation of the memory. Furthermore, the applied bias voltage is higher for unselected programmed memory cells having higher threshold voltages, resulting in a greater decrease in the electric field of these memory cells, which further reduces program disturb in the memory array.

In one embodiment of the present invention, a bias voltage Vbias1 is applied to unselected word-lines during programming if memory cells in the word-line have programmed threshold voltages at or above a reference voltage Vref1. However, if the unselected word-line contains memory cells with programmed threshold voltages below reference voltage Vref1 or memory cells that are erased, a ground potential is applied to these word-lines during subsequent programming of other word-lines. In another embodiment, an additional bias voltage Vbias2, whose value is between ground and Vbias1, can be applied to unselected programmed memory cells during programming of cells in other word-lines. In this case, if the programmed threshold voltage of the cell in the selected bit-line is less than reference voltage Vref1, but at or above a reference voltage Vref2 associated with Vbias2, then Vref2 is applied to the unselected programmed memory cells. If the programmed threshold voltage is below Vref2 or the cells are erased, then ground is applied, and if the programmed threshold voltage is at or above Vref1, bias voltage Vref1 is applied to the unselected programmed memory cells.

In yet another embodiment, two different non-zero bias voltages Vbias1 and Vbias2 are applied to unselected programmed memory cells, depending on whether the programmed threshold voltage of the cell on the selected bit-line is above or below a predetermined reference voltage Vref1. If the threshold voltage is at or above reference voltage Vref1, the higher of the two bias voltages Vbias1 is applied to the word-line containing the cell, and if the threshold voltage is below reference voltage Vref1, the lower of the two bias voltages Vbias2 is applied. These embodiments can be expanded to include additional fixed bias voltages corresponding to additional reference voltages.

In another embodiment of the present invention, a plurality of variable bias voltages is applied to unselected programmed cells, depending on the programmed threshold voltage of the cell on the selected bit-line. Once a memory cell is programmed (i.e., written with data), the threshold voltage for that cell is stored. When a cell is selected for programming, each of the programmed cells on the selected bit-line has a bias voltage applied that is slightly lower than the threshold voltage of the associated memory cell. As a result, the electric field of these unselected programmed cells is minimized during a programming operation on the selected bit-line.

The present invention will be more fully understood upon consideration of the detailed description below, taken together with the accompanying drawings.

BRIEF DESCRIPTION OF THE DRAWINGS

FIG. 1 is diagram of a conventional non-volatile semiconductor memory;

FIG. 2 is a diagram of a non-volatile semiconductor memory according to one embodiment of the present invention, in which two bias voltages are applied to unselected programmed memory cells;

FIG. 3 is a circuit diagram of a portion of a word-line selection and driver circuit of FIG. 2 according to one embodiment;

FIG. 4 are timing diagrams for the circuit of FIG. 3;

FIG. 5 is a diagram of a non-volatile memory according to another embodiment of the invention, in which three bias voltages are applied to unselected programmed memory cells;

FIG. 6 is a circuit diagram of a portion of a word-line selection and driver circuit of FIG. 5, according to one embodiment;

FIG. 7 is a circuit diagram of row decoding circuitry according to another embodiment, in which variable bias voltages are applied to unselected programmed y cells; and FIG. 8 are timing diagrams for the circuit of FIG. 7.

Use of the same reference symbols in different figures indicates similar or identical items.

DETAILED DESCRIPTION OF THE PREFERRED EMBODIMENTS

An erasable non-volatile semiconductor memory array such as an EPROM, EEPROM, or Flash memory conventionally includes memory cells organized into rows and columns where each memory cell includes a floating gate transistor or another device which has a threshold voltage that can be set to indicate stored data values. FIG. 1 illustrates a conventional erasable non-volatile memory 100 and memory array 150 that includes M rows and N columns of memory cells C11 to CMN. In array 150, each memory cell C11 to CMN is a single floating gate transistor which has a control gate coupled to one of word-lines WL1 to WLM, a drain coupled to one of bit-lines BL1 to BLN, and a source connected to a common source-line SL.

When writing a data value to a selected one of memory cells C11 to CMN, programming voltages are applied to the word-line and bit-line coupled to the selected memory cell and to the common source-line SL. For example, to write to memory cell C11, source-line SL is grounded, and a row decoder 130 and a column decoder 110 apply programming voltages to word-line WL1 and bit-line BL1, respectively. The magnitudes of the programming voltages depend on the structure of memory cells C11 to CMN and may depend on the data value being written. If memory array 150 is a typical Flash memory array, programming voltages of about 12 volts (Vpp) on word-line WL1, about 6 volts (Vdp) on bit-line BL1, and 0 volts (ground or Vss) on source-line SL, respectively, program memory cell C11 by channel hot electron (CHE) injection. Conventionally, row decoder 130 contains word-line drivers WLD1 to WLDM which apply a programming voltage Vpp to the word-line selected by a decoder tree 140 during a write. The word-line drivers WLD1 to WLDM conventionally ground unselected word-lines. Column decoder 110 applies the programming voltage to the selected bit line and disconnects unselected bit-lines BL2 to BLN.

Applying programming voltages Vpp and Vdp to the selected word-line and bit-line, respectively, also applies voltages Vpp and Vdp in different combinations to unselected memory cells and can disturb the threshold voltages of the unselected memory cells.

Table 1 shows typical voltages in memory cells C11, C21, C12, and C22 when writing to memory cell C11.

TABLE 1

|  | Vg | Vd | Vs |
| --- | --- | --- | --- |
| C11 | 12 | 6 | 0 |
| C21 | 0 | 6 | 0 |
| C12 | 12 | 0 | 0 |
| C22 | 0 | 0 | 0 |

The voltage difference between the floating gate and drain of unselected memory cells induces Fowler-Nordheim (F-N) tunneling that disturbs the threshold voltages of these unselected memory cells by causing electrons to tunnel out or escape from the floating gate to drain, causing program or drain disturb. A high drain voltage in conjunction with a low gate voltage can increase the electric field and cause significant drain disturb. The worst case for drain disturb occurs in memory cells in the same column as the selected cell, i.e., memory cells C21, C31, to CM1. Accordingly, the tunneling current which causes drain disturb in memory cell C21 (and in the other memory cells C31 to CM1 in the selected column) is the primary concern when reducing stress or disturbance of stored data values.

In accordance with an aspect of the invention, drain disturb is reduced by applying different bias voltages Vbias to word-lines corresponding to unselected memory cells to which data was written, with higher bias voltages applied to cells with higher threshold voltages. The capacitive coupling between the control gate and the floating gate of these unselected cells increases the potential of the floating gate in proportion to the bias voltage, thereby reducing the voltage drop across the tunnel layer between the drain and floating gate of memory cells subject to drain disturb. In addition, by increasing the voltages applied to word-lines containing memory cells having higher threshold voltages, the voltage difference between the drain and floating gate is further reduced, which reduces drain disturb of higher threshold voltage cells. Cells, such as memory cell C22, which are not in the same row or column as selected memory cell C11 also have their control gate voltage Vg raised, but disturb caused by the increase in control gate voltage Vg is insignificant (orders of magnitude less than the drain disturb of cells in the selected column).

The reduction in the tunneling current causing a drain disturb results in a substantial reduction in threshold voltage disturbance per write. Viewed in another way, the reduction in the tunneling current proportionally increases the maximum number of memory cells on a bit-line (i.e., the number of word-lines and the size of an array) allowed when a limit on accumulated threshold voltage disturb must be maintained. Memory cell density in analog and multi-level memory can therefore be increased providing more storage without extensive overhead in integrated circuit area.

One embodiment of the invention is a Flash memory for storing analog data. As is typical for Flash memory, after an erase of a memory array in the Flash memory, memory cells in the array have a distribution of threshold voltages, but the threshold voltages are all less than a cut-off voltage marking a boundary of an erased state for the memory cells. Writing an analog data value to a memory cell raises the threshold voltage of the memory cell to a level within a range that is in one-to-one correspondence with the possible analog data values storable in the memory cell. The range of programmed threshold voltages has a lower boundary, which is above the cut-off voltage for the erased state so that all erased memory cells are written to by increasing their threshold voltages. For example, following an erase of a typical Flash memory array, the memory cells in the array have threshold voltages between about 0.5 volts and about 1.5 volts. The minimum threshold voltage corresponding to a data value can be selected to be 2.0 volts or higher so that the selected bias voltages are below the minimum threshold voltage corresponding to a data value. Accordingly, applying the bias voltages do not turn on any memory cells that store data. However, bias voltages can be above the threshold voltages of some or all memory cells in the erased state because unselected word-lines connected to memory cells in the erased state are grounded during programming rather than being at a bias voltage. Reducing disturbance of erased memory cells is not critical because such disturbances do not change any data values.

FIG. 2 illustrates part of a non-volatile semiconductor memory 200 in accordance with an embodiment of the invention. Memory 200 includes an array 150 of memory cells C11 to CMN as described above. Memory cells C11 to CMN are single transistor floating gate memory cells, but other embodiments of the invention may employ other types of memory cells. During programming of a selected memory cell, an address signal generator 120 generates a row address signal and a column address signal which identify the selected memory cell, and a column decoder 110 and a row decoder 230 generate programming voltages on a selected bit-line and a selected word-line corresponding to the selected memory cell. Row decoder 230 includes a decoder tree 240, bias flag circuits F1 to FM, and word-line drivers D1 to DM.

In one embodiment, the bias flag circuits F1 to FM indicate which rows contain stored data above a reference voltage and which rows do not (which can be either rows with erased memory cells or rows with stored data below the reference voltage). Bias flag circuits according to this embodiment allow a bias voltage Vbias1 to be applied to unselected word-lines containing programmed memory cells above a reference voltage Vref1 or ground to be applied to unselected word-lines containing erased memory cells or programmed memory cells with threshold voltages below reference voltage Vref1. After each erase of memory array 150, all of bias flag circuits F1 to FM indicate none of rows contain data values. When writing a data value, decoder tree 240 asserts the one of select signals SELECT1 to SELECTM which corresponds to the selected row, and the one of drivers D1 to DM to which the select signal is asserted applies a programming voltage to the selected word-line. After a word-line is selected, the bias flag circuit associated with the selected word-line indicates whether the data that was written to the selected row is at or above reference voltage Vref1. If a memory cell in the selected row has a programmed threshold voltage at or above reference voltage Vref1, bias voltage Vbias1 is applied to the word-line if the word-line is unselected during a subsequent write with the same selected bit-line. However, if the programmed threshold voltage is below reference voltage Vref1 or if the row contains all erased memory cells, a low voltage such as ground is applied.

Whether particular ones of word-lines WL1 to WLM are grounded or at bias voltage Vbias1 when unselected depends on signal BIAS-SELECT1 to BIAS-SELECTM from the associated bias flag circuits F1 to FM. In one embodiment of the invention, each bias flag circuit F1 to FM acts as a volatile memory cell or latch which is set when the associated word-line WL1 to WLM is selected during a write and a memory cell in the selected word-line is programmed with a threshold voltage at or above a reference voltage. Flag circuits F1 to FM can be cleared when array 150 is erased or alternatively before each memory operation including reading from and writing to memory array 150. If a bias flag circuit indicates that an unselected row contains stored data and that stored data is at or above a threshold (i.e., reference voltage Vref1), the associated word-line driver applies bias voltage Vbias1 to the unselected word-line during a write to memory cells in the same bit-line. If the flag circuit indicates that an unselected row contains no data or the data is below the threshold, the associated word-line grounds the unselected word-line. Thus, in addition to programming voltages on the selected word-line, drivers D1 to DM apply a bias voltage to unselected word-lines containing stored data at or above a reference voltage and a ground potential to unselected word-lines that contain no stored data or stored data below the reference voltage.

In one embodiment of the invention, memory 200 stores a series of samples representing a continuous signal such as an audio signal. Each sample is an analog value or a multi-level value that is written into one of memory cells C11 to CMN. When recording the continuous signal (i.e., writing the samples), address signal generator 120 selects where each sample is written and generates consecutive address signals so that a column of memory cells is filled with data values before writing samples to the next column begins. For example, samples can be written sequentially beginning with memory cell C11 that is in the first row and first column. A programming voltage (e.g., 6 volts) is applied to the first (i.e., selected) bit-line EL1, and a programming voltage (e.g., 12 volts) is applied to the selected word-line WL1. While a data value is written to memory cell C11, all of the unselected word-lines WL2 to WLM are grounded because all of bias flag circuits F2 to FM were cleared following an erase. If memory cell C11 is programmed with a threshold voltage equal to or higher than reference voltage Vref1, bias flag circuit F1 asserts signal BIAS_SELECT1 to driver D1.

The column address signal remains constant while a row address signal generator 224 sequentially increments the row address signal for writing data values in memory cells C11 . . . CM1 in the first column. If memory cell C11 has a programmed threshold voltage at or higher than reference voltage Vref1, driver D1 applies bias voltage Vbias1 to word-line WL1 during a programming of memory cells C21 to CM1. Similarly, as memory cells C21 to CM1 are sequentially programmed, bias flag circuits F2 to FM will assert an associated signal BIAS_SELECT2 to BIAS_SELECTM high to the corresponding driver D2 to DM for each of the memory cells that are programmed with a threshold voltage at or higher than reference voltage Vref1. Thus, if signal BIAS_SELECT2 is asserted by flag circuit F2, driver D2 will apply bias voltage Vbias1 to word-line WL2 during programming of memory cells C31 to CM1. This type of programming continues until the last memory cell CM1 in bit-line BL1 is programmed. Thus, while programming bit-line BL1, drain disturb is reduced by applying bias voltage Vbias to unselected cells having programmed threshold voltages at or higher than a reference voltage Vref1.

After a data value is written to the last memory cell CM1 in the first column, column address signal generator 222 increments the column address signal, and signals BIAS_SELECT1 to BIAS_SELECTM are reset. Writing then continues column by column in a similar manner until memory cells in the last column, i.e., C1N to CMN, are programmed.

FIG. 3 shows row decoding circuitry 300 for programming a row of a non-volatile analog or multi-level memory cells connected to word-line WL2 of memory 200 (FIG. 2). Decoding circuitry 300 includes a decoder tree 340, a bias flag circuit F2, and a word-line driver D2 which are associated with word-line WL2. Decoding circuitry 300 for word-line WL2 is an example of similar decoding circuitry for each of word-lines WL1 to WLM. FIG. 4, which is described herein in conjunction with FIG. 3, shows timing diagrams for signals in decoding circuitry 300 and voltages on word-lines WL1 and WL3 which are adjacent to word-line WL2.

Bias flag circuit F2 contains a p-channel transistor 331 and an n-channel transistor 333 that are connected in series between ground and a supply voltage Vcc. Similar p-channel transistor 332 and n-channel transistor 334 are connected in series between voltage Vcc and ground. The gates of transistors 331 and 333 are connected to a node 338 between transistors 332 and 334, and the gates of transistors 332 and 334 are connected to a node 337 between transistors 331 and 333. In the manner of a standard SRAM cell, the voltages at nodes 337 and 338 are complementary and indicate a binary value stored in bias flag circuit F2. The voltage at node 338 is signal $\overline{\text{BIAS\_SELECT2}}$ and indicates whether word-line WL2 is selected for application of bias voltage Vbias1. Bias flag circuit F2 also contains a transistor 336 that is connected in parallel with transistor 333 and series-connected p-channel transistor 335 and n-channel transistor 350 that are connected in parallel with transistor 331.

At the beginning of any operation such as writing or reading or after an erase, a signal RESET is asserted high to the gate of transistor 336 to ground node 337 and reset bias flag circuit F2 to a state where signal $\overline{\text{BIAS\_SELECT2}}$ is high, indicating that word-line WL2 is not selected for application of bias voltage Vbias1 during programming. Similar circuits in decoding circuits for the other rows of the array are similarly reset by signal RESET. Once all bias flag circuits are reset, memory cells in the array can be selected and programmed if the memory cells were previously erased.

FIG. 4 shows a pulse beginning at time 410 before a write operation. A similar reset pulse is generated before a read operation. Resetting bias flag circuits F1 to FM before a read operation allows decoder tree 340 to select a row for a read but prevents the bias voltage from being applied to unselected word-lines WL1 to WLM during the read. During a read the maximum drain voltage can be kept less than 1.5 volts, for example, making the drain disturb orders of magnitude smaller than the programming disturb so that biasing unselected word-lines above the ground potential is not required. A transistor 339 between voltage Vcc and transistors 331, 335, and 350 disconnects voltage Vcc from transistors 331, 335, and 350 during a read. Accordingly, during a read, node 337 cannot be raised nor signal BIAS_SELECT2 asserted. During a write, transistor 339 applies voltage Vcc to transistors 331, 335, and 350.

Decoder tree 340 generates a signal $\overline{\text{SELECT2}}$ that indicates whether word-line WL2 is the selected word-line. A signal PRECHARGE and transistors 341 and 344 control dynamic precharge for select signal $\overline{\text{SELECT2}}$. At a time 420, before a write and while reset signal RESET is still asserted, a signal $\overline{\text{PRECHARGE}}$ is asserted low which turns on a p-channel transistor 341, turns off an n-channel transistor 344, and charges a node 342 providing signal $\overline{\text{SELECT2}}$ to a voltage Vcp. A charge pump or other high voltage source (not shown) supplies voltage Vcp that is greater than or equal to programming voltage Vpp. Row address signals A0 to AX and $\overline{\text{A0}}$ to $\overline{\text{AX}}$ are applied to decoder tree 340 during precharge which charges a conducting string of transistors 343 connected to node 342. Signal DISCHARGE is simultaneously asserted high which causes a transistor 329 in driver D2 to discharge any voltage remaining on word-line WL2. When signal $\overline{\text{PRECHARGE}}$ goes high, signal $\overline{\text{SELECT2}}$ remains high unless transistors 343 all conduct and pull signal $\overline{\text{SELECT2}}$ low. A unique combination of row address signals A0 to AX and their complements $\overline{\text{A0}}$ to $\overline{\text{AX}}$ is connected to the gates of transistors 343 in each copy of decode circuitry 300 so that only one row is selected.

Signals SELECT2 and BIAS_SELECT2 control driver D2 and determine the voltage applied to word-line WL2 during a write. Between times 430 and 440, a data value is written to the first memory cell C11 in the first row, word-line WL2 is unselected, and all of the memory cells connected to word-line WL2 are in the erased state. Accordingly, signals $\overline{\text{SELECT2}}$ and $\overline{\text{BIAS—SELECT2}}$ are both high. Signal $\overline{\text{SELECT2}}$ being high shuts off p-channel transistors 322 and 324 in driver D2 and disables application of a programming voltage Vpp and a verify voltage Vvfy to word-line WL2. Signal $\overline{\text{SELECT2}}$ being high also turns on n-channel transistors 326 and 327. Signal $\overline{\text{BIAS\_SELECT2}}$ being high turns on an n-channel transistor 328 and turns off a p-channel transistor 325. Accordingly, word-line WL2 is grounded through transistors 327 and 328, and is not connected to bias voltage Vbias1 through transistors 325 and 326.

At time 440, signals PRECHARGE and $\overline{\text{DISCHARGE}}$ are again asserted in preparation for changing the row address signal to select word-line WL2 after programming cell C11 in word-line WL1. Signal $\overline{\text{SELECT2}}$ is high and is applied to the gate of a p-channel transistor 335 that is connected in parallel with transistor 331 and in series with n-channel transistor 350. Transistor 335 is off which leaves signal $\overline{\text{BIAS\_SELECT2}}$ unchanged while signal $\overline{\text{SELECT2}}$ is high. At a time 450, when signal $\overline{\text{PRECHARGE}}$ is deasserted high, decoder tree 340 pulls signal $\overline{\text{SELECT2}}$ low, which shuts off transistor 327 and disconnects word-line WL2 from ground. Signal $\overline{\text{SELECT2}}$ being low turns on p-channel transistors 322 and 324 which connects word-line WL2 to p-channel transistors 321 and 323 and enables application of voltages Vpp and Vvfy, respectively. N-channel transistor 326 is turned off, disabling application of bias voltage Vbias1 during the programming operation.

In addition, when signal $\overline{\text{SELECT2}}$ is low, p-channel transistor 335 is turned on. Connected in series with transistor 335 is n-channel transistor 350, which has its gate coupled to verify voltage Vvfy. Transistor 350 is sized such that transistor 350 turns on at or above a reference voltage Vref1. Thus, if Vvfy, which represents the programmed threshold voltage for a particular memory cell being programmed, is at least equal to Vref1, then transistor 350 will turn on. Consequently, node 337 will be pulled high, which results in node 338, i.e., signal $\overline{\text{BIAS\_SELECT2}}$, being pulled low. However, if Vvfy is less than Vref1, n-channel transistor 350 is shut off, which leaves the latch unchanged with signal $\overline{\text{BIAS\_SELECT2}}$ remaining high.

FIG. 4 shows the voltage applied to word-line WL2 after time 450 when word-line WL2 is first selected for programming. The programming process illustrated in FIG. 4 uses a series of programming pulses 452 which are separated by a series of verify cycles 454. During each programming pulse 452, a signal $\overline{\text{PGM}}$ is asserted low which turns on p-channel transistor 321 and drives word-line WL2 to programming voltage Vpp (typically about 12 volts). Programming voltage Vpp combined with a programming voltage (typically about 6 volts) applied to the bit-line of the selected memory cell and a grounding of a source-line causes CHE injection which increases the threshold voltage of the selected cell.

During verify cycles 454, a signal $\overline{\text{VFY}}$ is asserted low while signal $\overline{\text{PGM}}$ is high. This turns on a p-channel transistor 323 and shuts off p-channel transistor 321 so that word-line WL2 is driven to verify voltage Vvfy. Voltage Vvfy is at a level indicating the data value being written and is therefore within the range of threshold voltages indicating data values (typically between 2 volts and 5 volts). During verify cycles, a sense circuit (not shown) determines whether the selected memory cell conducts while voltage Vvfy is applied to the control gate of the selected memory cell. The voltage on the selected bit-line during a verify cycle is decreased to about 1.5 volts. When the selected cell just begins to conduct during a verify cycle, the threshold voltage of the selected memory cell is about equal to voltage Vvfy and is at the desired threshold voltage to represent the analog or multi-level data value being written. Further programming pulses 452 are terminated, and the write to the selected memory cell C21 is complete. During programming of cell C21, driver D1 can apply either Vbias1 or ground to unselected word-line WL1, depending on the state of signal $\overline{\text{BIAS\_SELECT1}}$. The waveform in FIG. 4 assumes signal $\overline{\text{BIAS\_SELECT1}}$ was pulled low during programming of cell C11. However, if signal $\overline{\text{BIAS\_SELECT1}}$ remained high, then driver D1 would apply ground to WL1 during programming of memory cell C21.

Similarly, depending on whether signal $\overline{\text{BIAS\_SELECT2}}$ was pulled low or remained high after programming cell C21, driver D2 asserts bias voltage Vbias1 or ground, respectively, to unselected word-line WL2 when programming the next cell C31 on selected bit-line BL1. This time, in FIG. 4, it is assumed that signal $\overline{\text{BIAS\_SELECT2}}$ remained high. When cell C31 in word-line WL3 is being programmed, signal $\overline{\text{SELECT2}}$ is asserted high, which disables application of the programming voltage to word-line WL2 and turns on transistor 326. Also, when signal $\overline{\text{SELECT2}}$ goes high, signal $\overline{\text{BIAS}_{\text{SELECT2}}}$ will remain in its previous state. Thus, if signal $\overline{\text{BIAS—SELECT2}}$ had been pulled low, signal $\overline{\text{BIAS\_SELECT2}}$ remains low and shuts off n-channel transistor 328 to disconnect word-line WL2 from ground. In addition, signal $\overline{\text{BIAS—SELECT2}}$ being low turns on p-channel transistor 325 to connect word-line WL2 through transistors 325 and 326 to bias voltage Vbias. On the other hand, if signal $\overline{\text{BIAS\_SELECT2}}$ had been high, signal $\overline{\text{BIAS\_SELECT2}}$ remains high to keep transistor 328 on. With signal $\overline{\text{SELECT2}}$ also high, WL2 is pulled to ground through transistors 327 and 328.

This same voltage (i.e., Vbias1 or ground) is applied to unselected word-line WL2 as each memory cell on bit-line BL1 is sequentially programmed. The column address signal remains constant while each cell in a selected column is programmed in the same manner described above. For each memory cell, voltage Vvfy changes according to the data value being written. Voltage Vpp can be constant or can vary according to the data value being written. After the last memory cell in the first column is programmed, signal $\overline{\text{PRECHARGE}}$ is asserted low again, the column address signal is changed to select the next column (i.e., bit-line BL2), and signals $\overline{\text{BIAS\_SELECT1}}$ to $\overline{\text{BIAS\_SELECTM}}$ are reset high.

As a result, bias voltage Vbias1 is only applied to unselected word-lines where programmed cells have threshold voltages at or higher than the reference voltage Vref1. For example, if the range of programmed threshold voltages for the memory cells in array 150 is from 2 volts to 9 volts, Vref1Vbias1 can be set to 4 volts. In this case, Vbias1 can be set to 3 volts. Thus, all unselected word-lines containing memory cells with threshold voltages above 4 volts will have a 3 volt bias voltage applied during programming operations of another word-line. This higher bias voltage reduces drain disturb in higher programmed memory cells, but does not turn on lower programmed memory cells because this 3 volts bias voltage is not applied to cells having threshold voltages lower than 4 volts. Table 2 summarizes the application of bias voltages for this embodiment.

TABLE 2

| Memory cell on unselected word-line | voltage applied to unselected word-line |
| --- | --- |
| erased | 0 volts |
| programmed below Vref1 | 0 volts |
| programmed at or above Vref1 | Vbias1 |

In another embodiment, another bias voltage Vbias2, which is less than Vbias1, but greater than ground, is included as an additional bias voltage to be applied to unselected programmed memory cells. Thus, three different bias voltages are applied to unselected programmed memory cells, ground, Vbias1, and Vbias2, depending on whether the programmed threshold voltage of the cell on the selected bit-line is above or below two predetermined reference voltages Vref1 and Vref2. If the threshold voltage is below both Vref1 and Vref2, then a ground potential is applied to the word-line during subsequent programming of cells in other word-lines. If the threshold voltage is at or above Vref2, but below Vref1, the lower of the two bias voltages Vbias2 is applied to the word-line containing the programmed cell during subsequent programming of memory cells in other word-lines. If the threshold voltage is at or above both Vref1 and Vref2, the higher bias voltage Vbias1 is applied.

FIG. 5 shows one embodiment of a row decoder 530, for use in the memory 200 of FIG. 2 for implementing the above-described word-line biasing. Row decoder 530 is similar to row decoder 230 of FIG. 2, except that there are two bias flag circuits F and F' for each word-line driver D. Also, each word-line driver has an additional pull-up circuitry for applying an additional bias voltage to the corresponding word-line. FIG. 6 shows row decoding circuitry 600 for programming a row of a memory cells connected to word-line WL2 of row decoder 530 of FIG. 5. Decoding circuitry 600 is identical to decoding circuitry 300 of FIG. 3, with the exception of an additional flag bias circuit F2' and an additional transistor 610 and bias voltage circuitry for applying voltage Vbias2 to word-line WL2 in driver D2. Flag circuit F2' is identical to flag circuit F2, with the same input signals READ, $\overline{SELECT2}$, Vvfy, and RESET, except that n-channel transistor 350 is replaced with an n-channel transistor 650 that is sized differently than transistor 350. Transistor 350 is sized to turn on when Vvfy is at or greater than Vref1, and transistor 650 is sized to turn on when Vvfy is at or greater than Vref2, with Vref1 greater than Vref2. Flag circuit F2 outputs signal $\overline{BIAS\_SELECT2}$, which is associated with bias voltage Vbias1, and flag circuit F2' outputs signal $\overline{BIAS\_SELECT2'}$, which is associated with bias voltage Vbias2, with Vbias1 being greater than Vbias2.

During programming of a memory cell in WL2, a series of program and verify pulses are applied to WL2 to program the selected cell. When the cell is properly programmed with the desired threshold voltage (Vvfy), programming is completed. During the programming operation, voltage Vvfy applied to transistors 350 and 650 can either 1) fail to turn on either of the two transistors 350 or 650, 2) turn on transistor 650 only (transistor 350 has the lower conductance), or 3) turn on both transistors 350 and 650. In the first case, with signals $\overline{SELECT2}$, READ, and RESET low, signals $\overline{BIAS\_SELECT2}$ and $\overline{BIAS\_SELECT2'}$ remain high, in the second case, signal $\overline{BIAS\_SELECT2}$ remains high, but signal $\overline{BIAS_{13}SELECT2'}$ is pulled low, and in the third case, signals $\overline{BIAS\_SELECT2}$ and $\overline{BIAS\_SELECT2'}$ both are pulled low.

When programming memory cells in another word-line, i.e., WL3, signal $\overline{SELECT2}$ is set high by decoder tree 340, and signals $\overline{BIAS\_SELECT2}$ and $\overline{BIAS\_SELECT2'}$ remain in the same state set during programming of WL2. Thus, in the first case, when signals $\overline{BIAS\_SELECT2}$ and $\overline{BIAS\_SELECT2'}$ are both high, indicating that the cell programmed in WL2 has a threshold voltage lower than both Vref1 and Vref2, transistors 327, 328, and n-channel transistor 610 are turned on, thereby pulling WL2 to ground. Also, p-channel transistor 325 is turned off, which disconnects bias voltage Vbias1 from WL2, and a p-channel transistor 662, coupled between bias voltage Vbias2 and WL2, is turned off to disconnect Vbias2 from WL2. Thus, a ground potential is applied to WL2 during programming of subsequent cells in other word-lines.

In the second case, when signal $\overline{BIAS\_SELECT2}$ is high and signal $\overline{BIAS\_SELECT2'}$ is low, indicating that programmed cell in WL2 has a threshold voltage at or above Vref2, but less than Vref1, n-channel transistor 610 is turned off, which disconnects WL2 from ground. Furthermore, signal $\overline{BIAS\_SELECT2}$ being high turns off p-channel transistor 325, which isolates Vbias1 from WL2. However, with signal $\overline{BIAS\_SELECT2'}$ low, p-channel transistor 662 is on, as are n-channel transistors 663 and 664, which are connected in series between transistor 662 and WL2. Thus, WL2 is at bias voltage Vbias2, which is applied to WL2 during programming of memory cells in other word-lines.

In the third case, when signals $\overline{BIAS\_SELECT2}$ and $\overline{BIAS\_SELECT2'}$ are both low, indicating that the memory cell in WL2 has been programmed with a threshold voltage higher than Vref1 and Vref2, WL2 is disconnected from ground by transistors 328 and 610 being off and from Vbias2 by n-channel transistor 363 being off. However, with signal $\overline{BIAS\_SELECT2}$ low and signal $SELECT2$ high, transistor 325 and 326 are on, which connects bias voltage Vbias1 to WL2 during subsequent programming of memory cells on other word-lines. Table 3 below summarizes the various bias voltages applied to programmed memory cells in unselected word-lines according to this embodiment.

TABLE 3

| Memory cell on unselected word-line | voltage applied to unselected word-line |
| --- | --- |
| erased | 0 volts |
| programmed below Vref2 | 0 volts |
| programmed at or above Vref2, but below Vref1 | Vbias2 |
| programmed at or above Vref1 | Vbias1 |

The above-described embodiment allows three bias voltages (ground, Vbias1, and Vbias2) to be applied to unselected word-lines containing programmed memory cells. However, this can be modified so that only two non-zero bias voltages are applied. In this embodiment, referring to FIG. 6, n-channel transistor 650 is removed from bias flag circuit F2'. As a result, signal $\overline{BIAS\_SELECT2'}$ is pulled low by signal $\overline{SELECT2}$ being low whenever a memory cell in word-line WL2 is programmed. Thus, if the memory cell on WL2 is programmed with a threshold voltage lower than a reference voltage Vref1, i.e., Vvfy does not turn on transistor 350, which leaves signal $\overline{BIAS\_SELECT2}$ high, a lower bias voltage Vbias2 will be connected to WL2. In this case, voltage Vbias2 will be applied to programmed memory cells on WL2 during programming of memory cells on other word-lines. However, if the memory cell on WL2 is programmed with a threshold voltage at or higher than reference voltage Vref1, i.e., Vvfy turns on transistor 350, which pulls signal $\overline{BIAS\_SELECT2}$ low, a higher bias voltage Vbias1 will be applied to the gates of programmed memory cells when other word-lines are being programmed. Thus, if the programmed memory cell has a threshold voltage at or above reference voltage Vref1, the higher of two bias voltages is applied to the word-line when programming other word-lines. Otherwise, if the programmed memory cell has a threshold voltage below reference voltage Vref1, the lower bias voltage is applied. This is summarized in Table 4 below.

TABLE 4

| Memory cell on unselected word-line | voltage applied to unselected word-line |
| --- | --- |
| erased | 0 volts |
| programmed below Vref1 | Vbias2 |
| programmed at or above Vref1 | Vbias1 |

While the previous discussion has involved applying two non-zero bias voltages to unselected word-lines containing programmed memory cells, additional non-zero bias voltages can be applied by extending the row decoder and decoding circuitry of FIGS. 5 and 6, respectively. By adding K additional bias flag circuits F or F', with each n-channel transistor that is coupled to Vvfy sized to turn on at a voltage corresponding to a particular bias voltage, K additional $\overline{BIAS\_SELECT2}$ or $\overline{BIAS\_SELECT2'}$ signals are generated to driver D2. Within driver D2, K additional pull-up devices are added, which couple each of the additional bias voltages to word-line WL2.

In another embodiment of the present invention, instead of applying bias voltages of set values, variable bias voltages are applied to unselected word-lines containing programmed memory cells, with the bias voltage dependent upon the programmed threshold voltage of the cell on the selected bit-line. Once a memory cell is programmed (i.e., written with data), the threshold voltage for that cell is stored. When a cell is selected for programming, each of the programmed cells on the selected bit-line has a bias voltage applied that is slightly lower than the threshold voltage of the associated memory cell.

Referring back to FIG. 2, bias flag circuits F1 to FM indicate which rows contain stored data and which rows do not. If the selected row does not contain data, i.e., erased memory cells, then the associated word-line driver applies ground to the corresponding word-line when programming another cell on the same bit-line. However, if the selected row does contain data, then the associated word-line driver applies a bias voltage dependent on the magnitude of the stored data when programming another cell on the same bit-line. As the programmed threshold voltage increases, the applied bias voltage increases.

As with the previous embodiments, the memory cells are programmed sequentially one column at a time. After an erase of all the cells in the array, in which signals BIAS_SELECT1 to BIAS_SELECTM are reset, programming begins with memory cell C11 in word-line WL1 and bit-line BL1. After cell C11 is programmed, signal $\overline{BIAS\_SELECT}1$ is asserted to indicate that word-line WL1 contains data. Driver D1 stores a value proportional to the programmed threshold voltage of cell C11. Thus, when memory cell C21 is programmed, driver D1 applies the stored bias voltage to word-line WL1. This continues until the last memory cell CM1 is programmed in bit-line BL1. If each of the preceding memory cells was programmed with a different threshold voltage, then M−1 different bias voltages will be applied during programming of cell CM1. Typically the applied bias voltages are slightly lower the corresponding threshold voltages.

FIG. 7 shows one embodiment of row decoding circuitry 700 for programming a row of a non-volatile memory cells connected to word-line WL2 of memory 200 (FIG. 2) for the above-described embodiment. Decoding circuitry 700 includes a decoder tree 340, which is the same as in FIG. 3, a bias flag circuit F2, and a word-line driver D2 which are associated with word-line WL2. Decoding circuitry 700 for word-line WL2 is an example of similar decoding circuitry for each of word-lines WL1 to WLM.

Bias flag circuit F2 is similar to the bias flag circuit of FIG. 3, with the exception that n-channel transistor 350 is omitted. The operation of bias flag circuit F2 is essentially the same as in FIG. 3. As before, at the beginning of any operation such as writing or reading or after an erase, a signal RESET is asserted high to the gate of transistor 336 to ground node 337 and reset bias flag circuit F2 to a state where signal $\overline{BIAS\_SELECT2}$ is high, indicating that word-line WL2 is not selected for application of a bias voltage during programming. Before programming a memory cell in word-line WL2, signals $\overline{SELECT2}$ and $\overline{BIAS\_SELECT2}$ are both high, which grounds WL2 through transistors 327 and 328, as before. In addition, signal $\overline{BIAS\_SELECT2}$ is coupled to the gate of an n-channel transistor 751, which is coupled between ground and one plate of a discharge capacitor C. The other plate of capacitor C is connected to ground. With signal $\overline{BIAS\_SELECT2}$ high prior to programming a memory cell in word-line WL2, which turns on transistor 751, any charge on capacitor C is discharged through transistor 751.

When programming a memory cell in WL2, signal $\overline{SELECT2}$ is pulled low from decoder tree 340. Signal $\overline{SELECT2}$ being low turns on p-channel transistor 335, which with p-channel transistor 339 being on and no other transistor between Vcc and node 337, pulls node 337 high. As a result, node 338 or signal $\overline{BIAS\_SELECT2}$ is pulled low. Thus, with this embodiment, signal $\overline{BIAS\_SELECT2}$ is always pulled low when memory cells in WL2 are being programmed.

Also, with the embodiment shown in FIG. 7, word-line driver D2 stores and applies a voltage proportional to the programmed threshold voltage, instead of a constant bias voltage. Thus, compared with the word-line driver of FIG. 3, word-line driver D2 of FIG. 7 includes two n-channel transistor 751 and 752, an inverter 753, and capacitor C, which allows charge proportional to the verify voltage Vvfy to be stored and discharged. Also, because constant voltage Vbias1 is no longer required, transistor 325 and 326 of FIG. 3, which connected Vbias1 to WL2, are deleted.

During programming of memory cells in word-line WL2, signal $\overline{BIAS\_SELECT2}$ is low, which turns off n-channel transistor 751, thereby floating the plate of capacitor C coupled to word-line WL2 via transistor 329. Also, during programming operation, alternating program and verify voltages Vpp and Vvfy are applied to word-line WL2 until the memory cell is programmed with the desired threshold voltage, similar to that described above with respect to FIGS. 3 and 4. Since at this time, signal DISCHARGE is low (turning off transistor 329), capacitor C remains discharged at ground. However, if significant leakage occurs through transistor 329, capacitor C may accumulate undesirable charge. In this case, an additional n-channel transistor 752 coupled between ground and the top plate of capacitor C can be included to prevent capacitor C from charging during programming since any current leaking from WL2 through transistor 329 is discharged to ground via transistor 752. N-channel transistor 752 is coupled to signal $\overline{SELECT2}$ through inverter 753. Thus, when signal $\overline{SELECT2}$ is low (during programming), transistor 752 is on, which keeps capacitor C discharged. Note that transistor 752 and inverter 753 are not needed if no significant leakage is expected through transistor 329.

After the desired threshold voltage has been programmed, indicated by voltage Vvfy turning on the programmed memory cell, signal DISCHARGE is set high, thereby turning on transistor 329. As before, signal PRECHARGE is set low, which pulls signal $\overline{\text{SELECT2}}$ high and turns off n-channel transistor 752. The charge on WL2, proportional to voltage Vvfy, is then allowed to discharge onto capacitor C. Because WL2 no longer discharges completely to ground, but rather shares charge with capacitor C, a non-zero voltage remains on WL2 during and after the discharge cycle, as shown in FIG. 8. The amount of voltage remaining on WL2 is dependent on the size of capacitor C, as compared to the capacitance of WL2, i.e., the voltage on word-line WL2 Vwl2 is given by the following equation:

$$Vwl2 = \frac{Vvfy * Cwl}{(Cwl + Cdis)} \quad (1)$$

where Cwl is the word-line capacitance and Cdis is the capacitance of the discharge capacitor C. The smaller the capacitance of C, the higher percentage of voltage Vvfy will remain on word-line WL2 after discharge. For example, if Cdis=Cwl, then Vwl2=0.5*Vvfy, but if Cdis=0.25*Cwl, then Vwl2=0.8*Vvfy.

After the memory cell in word-line WL2 has been programmed, the memory cell in the next word-line, i.e., WL3, will be programmed. As before, signal $\overline{\text{SELECT2}}$ is asserted high, which disables application of the programming voltage to word-line WL2 and turns on transistor 326. Also, when signal $\overline{\text{SELECT2}}$ goes high, signal $\overline{\text{BIAS\_SELECT2}}$ will remain in its previous state. Thus, if signal $\overline{\text{BIAS\_SELECT2}}$ had been pulled low, signal $\overline{\text{BIAS\_SELECT2}}$ remains low and keeps n-channel transistor 328 off, thereby keeping word-line WL2 from discharging to ground. Thus, the voltage on WL2, given above by equation (1), is applied as a bias voltage to WL2 during programming of memory cells on subsequent word-lines. On the other hand, if signal $\overline{\text{BIAS\_SELECT2}}$ had been high, signal $\overline{\text{BIAS\_SELECT2}}$ remains high to keep transistor 328 on. With signal $\overline{\text{SELECT2}}$ also high, WL2 is pulled to ground through transistors 327 and 328, as before.

Although the invention has been described with reference to particular embodiments, the description is only an example of the invention's application and should not be taken as a limitation. For example, the present invention was described with various implementations of applying a bias voltage to unselected word-lines, with the amount of bias voltage dependent on the programmed threshold voltage. However, other implementations and memory arrays are also suitable use with this invention, in which different bias voltages are applied to unselected programmed memory cells. Various adaptations and combinations of features of the embodiments disclosed are within the scope of the invention as defined by the following claims.

I claim:

1. A method for writing a data value to a selected memory cell in an array of memory cells, comprising simultaneously:
   applying a first voltage to a first word-line in the array, wherein the memory cell is coupled to the first word-line, and application of the first voltage and voltages applied to a source and a drain of the selected memory cell changes the threshold voltage of the selected memory cell towards a state indicating the data value being written;
   applying a second voltage to a second word-line in the array, wherein a memory cell coupled to the second word-line is in an erased state; and
   applying a third voltage to a third word-line in the array, wherein a memory cell coupled to the third word-line has been written with a data value not corresponding to the erased state, the third voltage being dependent on the magnitude of the data value written to the memory cell coupled to the third word-line.

2. The method of claim 1, wherein the first voltage is greater than the third voltage, and the third voltage is greater than the second voltage.

3. The method of claim 1, wherein the third voltage is applied only when the magnitude of the data value written is at or above a first non-zero threshold voltage.

4. The method of claim 3, further comprising simultaneously applying a fourth voltage to a fourth word-line in the array, wherein memory cells coupled to the fourth word-line have been written with data values, the magnitude of the data value written to the memory cell in the fourth word-line coupled to the selected bit-line being less than the first non-zero threshold voltage.

5. The method of claim 4, wherein the second and fourth voltages are approximately 0 volts.

6. The method of claim 4, wherein the fourth voltage is less than the third voltage and greater than the second voltage.

7. The method of claim 4, further comprising simultaneously applying a fifth voltage to a fifth word-line in the array, wherein memory cells coupled the fifth word-line have been written with data values, the magnitude of the data value written to the memory cell in the fifth word-line coupled to the selected bit-line being less than a second non-zero threshold voltage, and wherein the magnitude of the data value written to the memory cell in the fourth word-line coupled to the selected bit-line is at or greater than the second non-zero threshold voltage.

8. The method of claim 7, wherein the second and fifth voltages are approximately 0 volts.

9. The method of claim 7, wherein the fifth voltage is less than the fourth voltage and greater than the second voltage, and the fourth voltage is less than the third voltage.

10. The method of claim 1, wherein the magnitude of the third voltage is less than the magnitude of the data value written to the memory cell in the third word-line coupled to the selected bit-line.

11. The method of claim 10, further comprising storing a portion of the magnitude of the data value written to the memory cell in the third word-line coupled to the selected bit-line for determining the magnitude of the third voltage.

12. The method of claim 1, wherein the data value being written is an analog value.

13. The method of claim 1, wherein the data value being written is from a set of discrete values.

14. The method of claim 1, further comprising writing data values to sequential addresses so that each memory cell in one column is written to before memory cells in an adjacent column are written to, wherein:
   writing one of said data values to a memory cell raises the threshold voltage of the memory cell above the third voltage;
   applying the third voltage comprises applying the third voltage to each word-line other than the first word-line, if the memory cell coupled to the word-line in the selected bit-line has been written; and
   applying the second voltage comprises applying the second voltage to each word-line other than the first word-line, if the memory cell coupled to the word-line in the selected bit-line has not been written.

* * * * *